(12) United States Patent
Tsui et al.

(10) Patent No.: US 10,993,335 B1
(45) Date of Patent: Apr. 27, 2021

(54) CLAMPING DEVICE FOR PROTECTION CASING OF ELECTRONIC DEVICE

(71) Applicants: Yun-Chang Tsui, Taipei (TW); Sampson Yang, Irvine, CA (US); Cheng-Han Yu, Taipei (TW)

(72) Inventors: Yun-Chang Tsui, Taipei (TW); Sampson Yang, Irvine, CA (US); Cheng-Han Yu, Taipei (TW)

(73) Assignee: The Joy Factory, Inc., Irvine, CA (US)

( * ) Notice: Subject to any disclaimer, the term of this patent is extended or adjusted under 35 U.S.C. 154(b) by 0 days.

(21) Appl. No.: 16/716,514

(22) Filed: Dec. 17, 2019

(51) Int. Cl.
*H05K 5/00* (2006.01)
*H05K 5/03* (2006.01)
*G06F 1/16* (2006.01)

(52) U.S. Cl.
CPC ......... *H05K 5/0008* (2013.01); *G06F 1/1626* (2013.01); *H05K 5/03* (2013.01)

(58) Field of Classification Search
CPC ...... H04B 1/3888; H05K 5/0008; H05K 5/03; G06F 1/1626

USPC ....................................................... 455/575.8
See application file for complete search history.

(56) References Cited

U.S. PATENT DOCUMENTS

| 8,259,930 B2 * | 9/2012 | Kawasaki | ............... H04R 7/045 |
| | | | 379/433.04 |
| 2016/0080024 A1 * | 3/2016 | Wilson | .................... H04M 1/18 |
| | | | 455/575.8 |

* cited by examiner

*Primary Examiner* — Eugene Yun

(57) ABSTRACT

A clamping device for a protection casing of an electronic device serves to clamp a protection casing for receiving an electronic device. The protection casing includes an upper cover for covering an upper side of the electronic device and a lower cover for covering a lower side of the electronic device; and in assembly state, the upper cover is connected to the lower cover to enclose the electronic device. The clamping device comprises an upper clamping frame and a lower clamping frame for clamping the protection casing therein. A combining structure is arranged on lateral sides of the upper clamping frame and the lower clamping frame for combining the upper clamping frame and the lower clamping frame so that the upper clamping frame and the lower clamping frame clamp the protection casing tightly and thus the protection casing retains its function for a long time.

9 Claims, 12 Drawing Sheets

CLAMPING DEVICE FOR PROTECTION CASING OF ELECTRONIC DEVICE

FIELD OF INVENTION

The present invention relates to a device for fixing a protection casing of an electronic device, and in particular to a clamping device for a protection casing of an electronic device.

BACKGROUND OF INVENTION

The protection casing of a prior art mainly includes an upper cover having an approximately rectangular shape for closing an upper side of a tablet electronic device, and a lower cover having a shape corresponding to that of the upper cover. The lower cover serves to close a lower side of the tablet electronic device. In assembly state, the upper cover buckles the lower cover directly and thus the tablet electronic device is enclosed therein. Therefore, the protection casing can protect the tablet electronic device.

However, in the conventional protection casing of the prior art, the upper cover buckles the lower cover directly so that the protection casing does not have enough tightness. When the protection casing is collided or moved by a user, the upper cover and the lower cover are easy to separate from each other so that the ability of anti-collision of the protection casing is reduced. Therefore, the tablet electronic device tends to expose out of the upper cover and the lower cover to cause the tablet electronic device collides the outer object and is damaged. Because the upper cover and the lower cover are easy to separate from each other, the function of waterproof will be destroyed. As a result, dusts or water is easy to enter into the protection casing.

Therefore, the inventor of the present invention desires to design a novel design, which can improve the defects as said above.

SUMMARY OF THE INVENTION

To improve above defects in the prior art, the present invention provides a clamping device for a protection casing of an electronic device. In the present invention, the upper clamping frame, the lower clamping frame and the combining structure form a clamping device. The combining structure serves to combine the upper clamping frame and the lower clamping frame to cause the upper clamping frame and the lower clamping frame can clamp the protection casing tightly so that the protection casing retains its function for a long time. The clamping device of the present invention can cause that the whole structure has higher strength and the ability of anti-collision. Therefore, the clamping device of the present invention prevents the protection casing from breaking down due to collision or overdoing of operating actions. Moreover, with the clamping device of the present invention, the protection casing will have a higher sealing tightness and thus dusts or water is impossible to enter into the protection casing.

To achieve above object, the present invention provides a clamping device for a protection casing of an electronic device; the clamping device serving to clamp a protection casing for receiving an electronic device; wherein the protection casing includes an upper cover for covering an upper side of the electronic device and a lower cover for covering a lower side of the electronic device; and in assembly state, the upper cover is connected to the lower cover and thus the electronic device is enclosed therein; the clamping device comprising: an upper clamping frame for clamping the protection casing at an upper side thereof; a lower clamping frame for clamping the protection casing at a lower side thereof; and a combining structure arranged on lateral sides of the upper clamping frame and the lower clamping frame; the combining structure serving to combine the upper clamping frame and the lower clamping frame so that the upper clamping frame and the lower clamping frame clamp the protection casing tightly and thus the protection casing retains its function for a long time.

DETAILED DESCRIPTION OF THE INVENTION

In order that those skilled in the art can further understand the present invention, a description will be provided in the following in details. However, these descriptions and the appended drawings are only used to cause those skilled in the art to understand the objects, features, and characteristics of the present invention, but not to be used to confine the scope and spirit of the present invention defined in the appended claims.

Figure 1A:
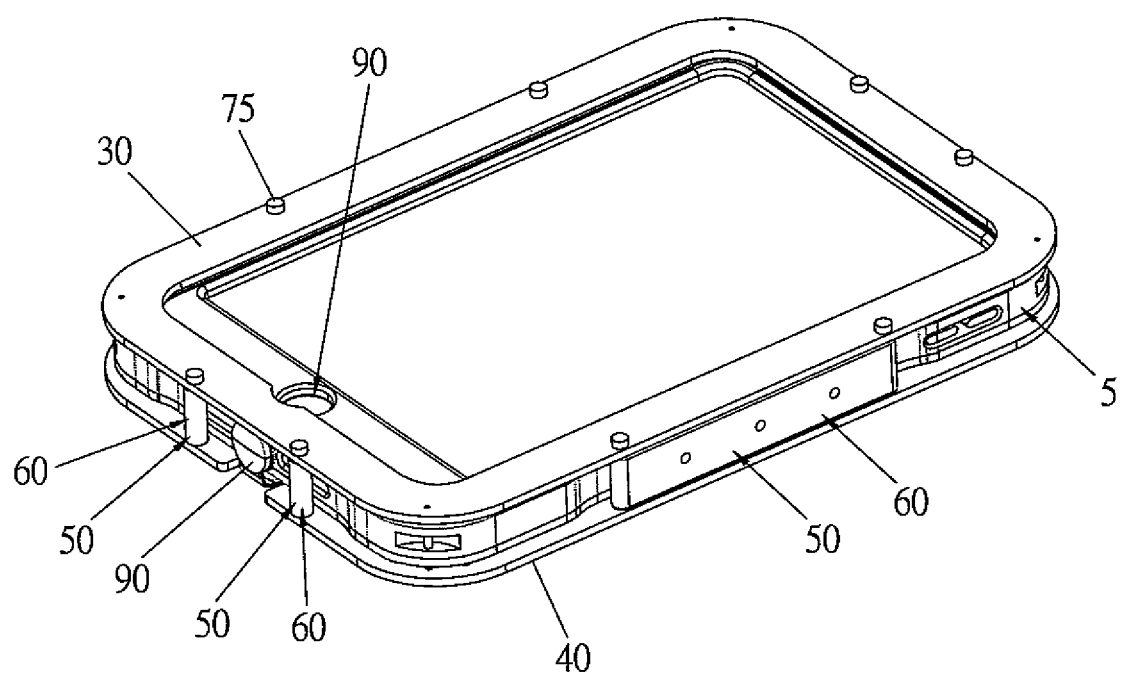
FIG. 1A is an assembly schematic view of the first embodiment of the present invention.
Figure 1B:
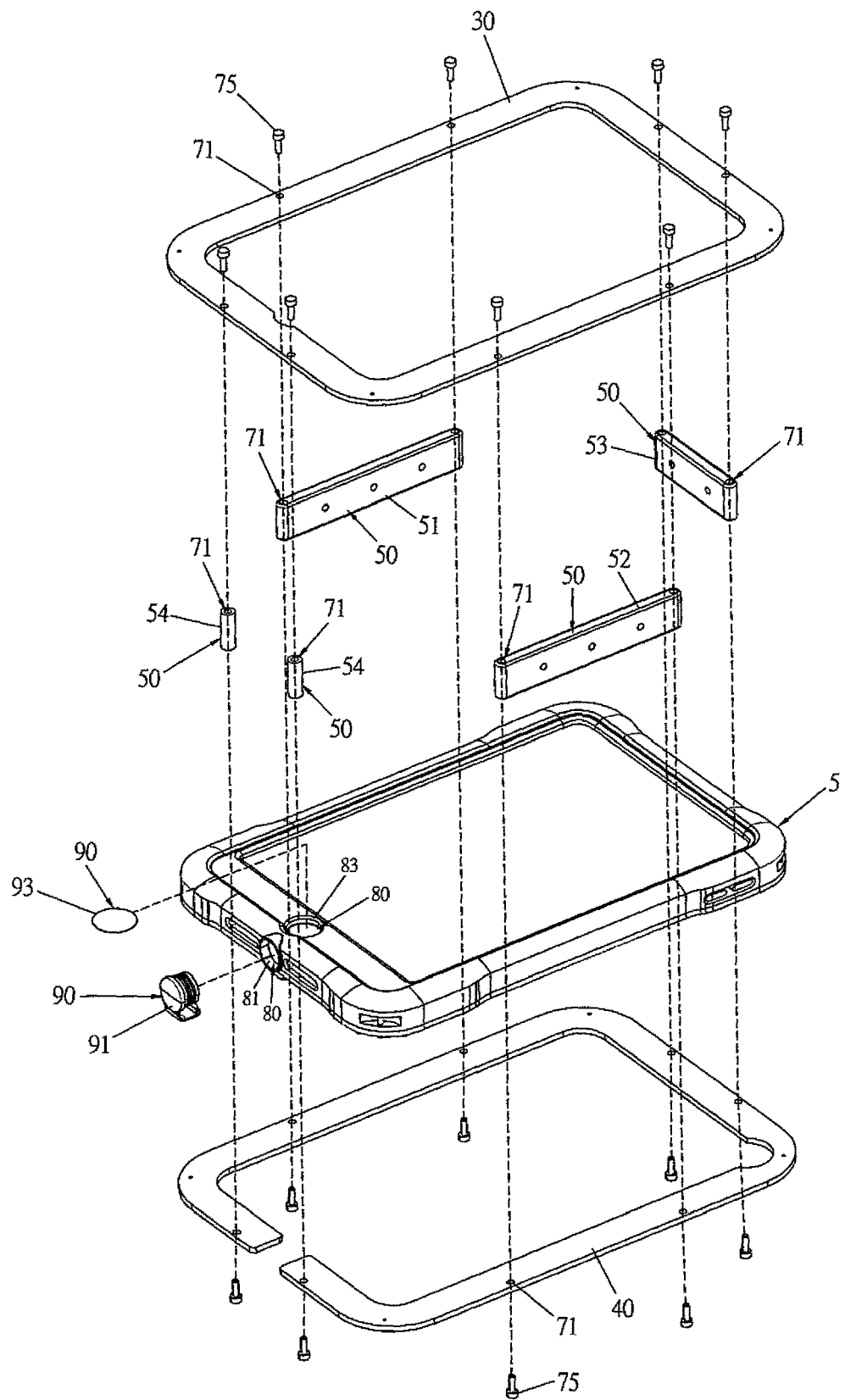
FIG. 1B is an exploded schematic view of the first embodiment of the present invention.
Figure 1C:
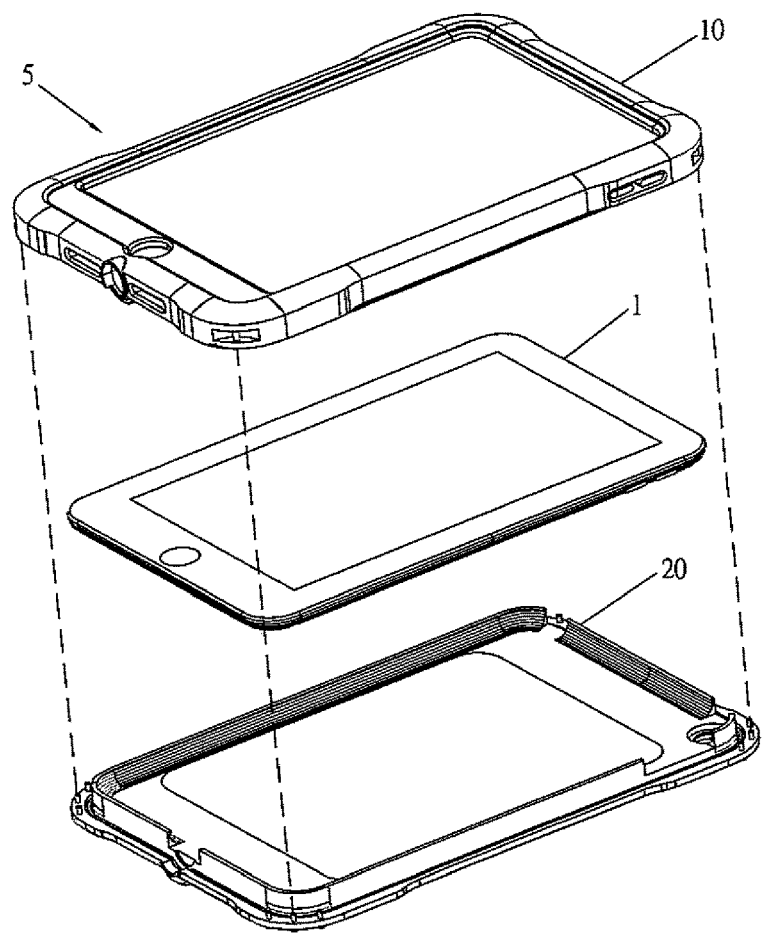
FIG. 1C is an exploded schematic view of the protection casing of the first embodiment of the present invention.
Figure 1D:
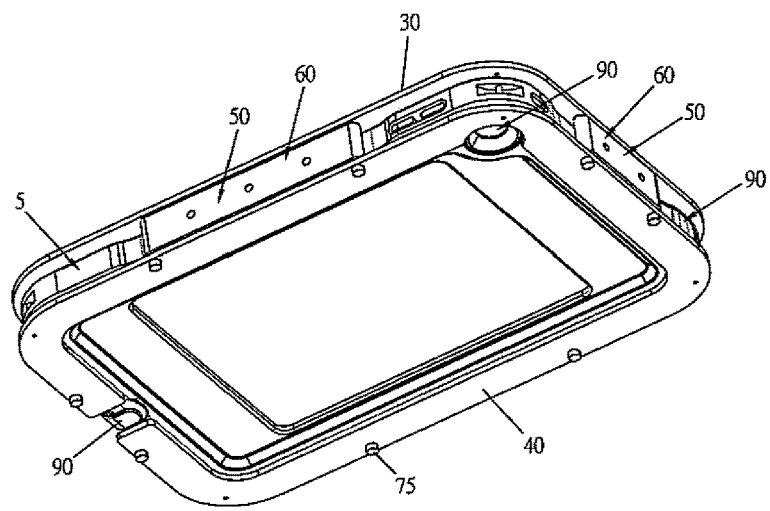
FIG. 1D is an assembly schematic view showing the bottom of the backside of the element in the first embodiment of the present invention.
Figure 1E:
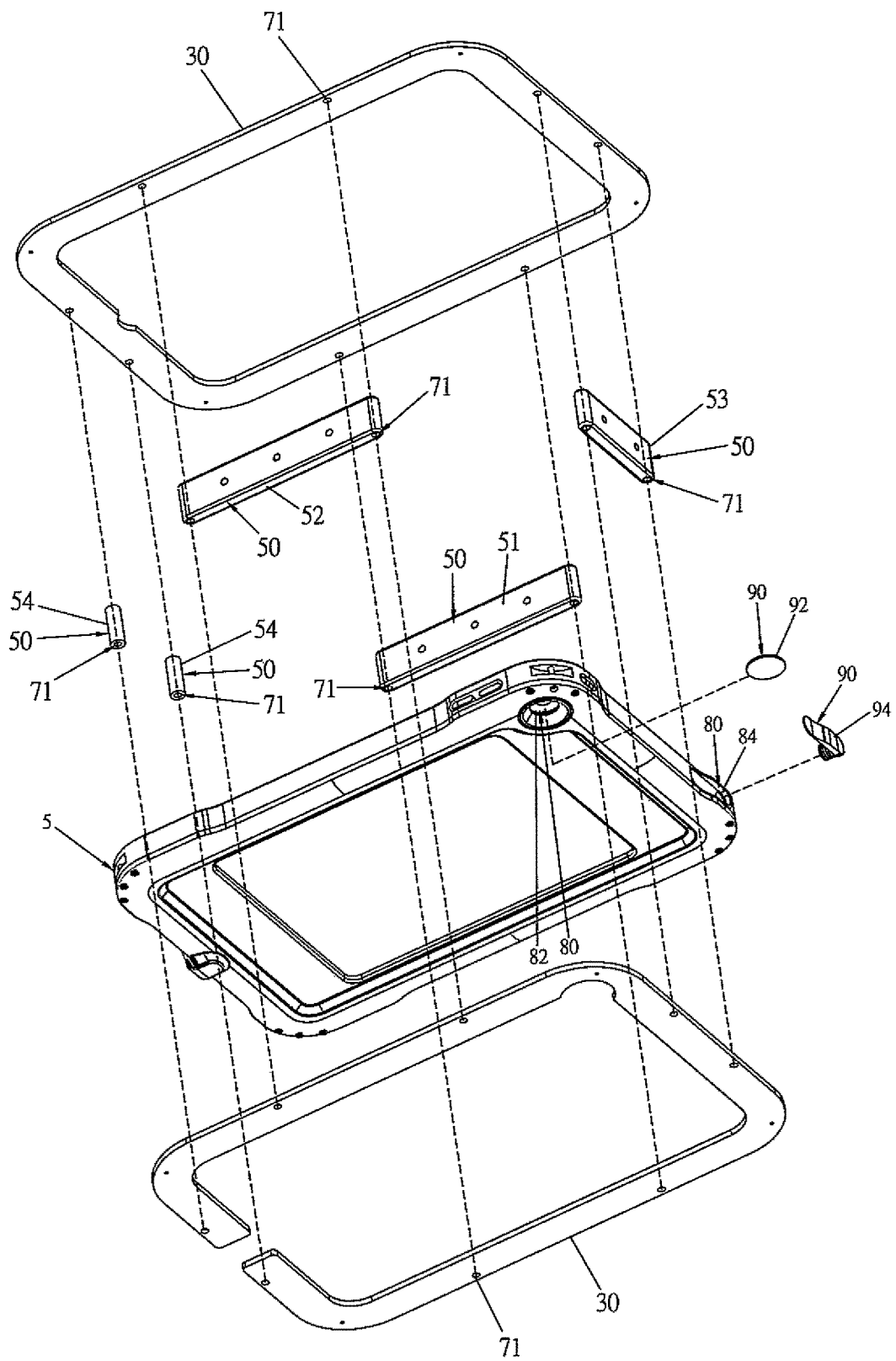
FIG. 1E is an exploded schematic view showing the bottom of the backside of the element in the first embodiment of the present invention, wherein the screws are not shown.
Figure 2A:
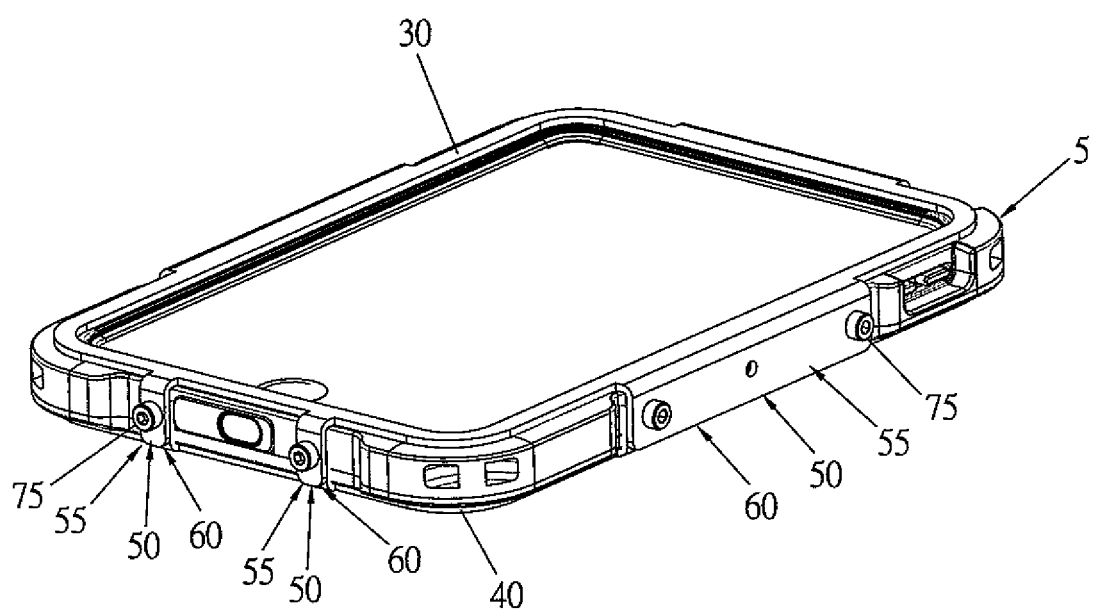
FIG. 2A is an assembly schematic view of the second embodiment of the present invention.
Figure 2B:
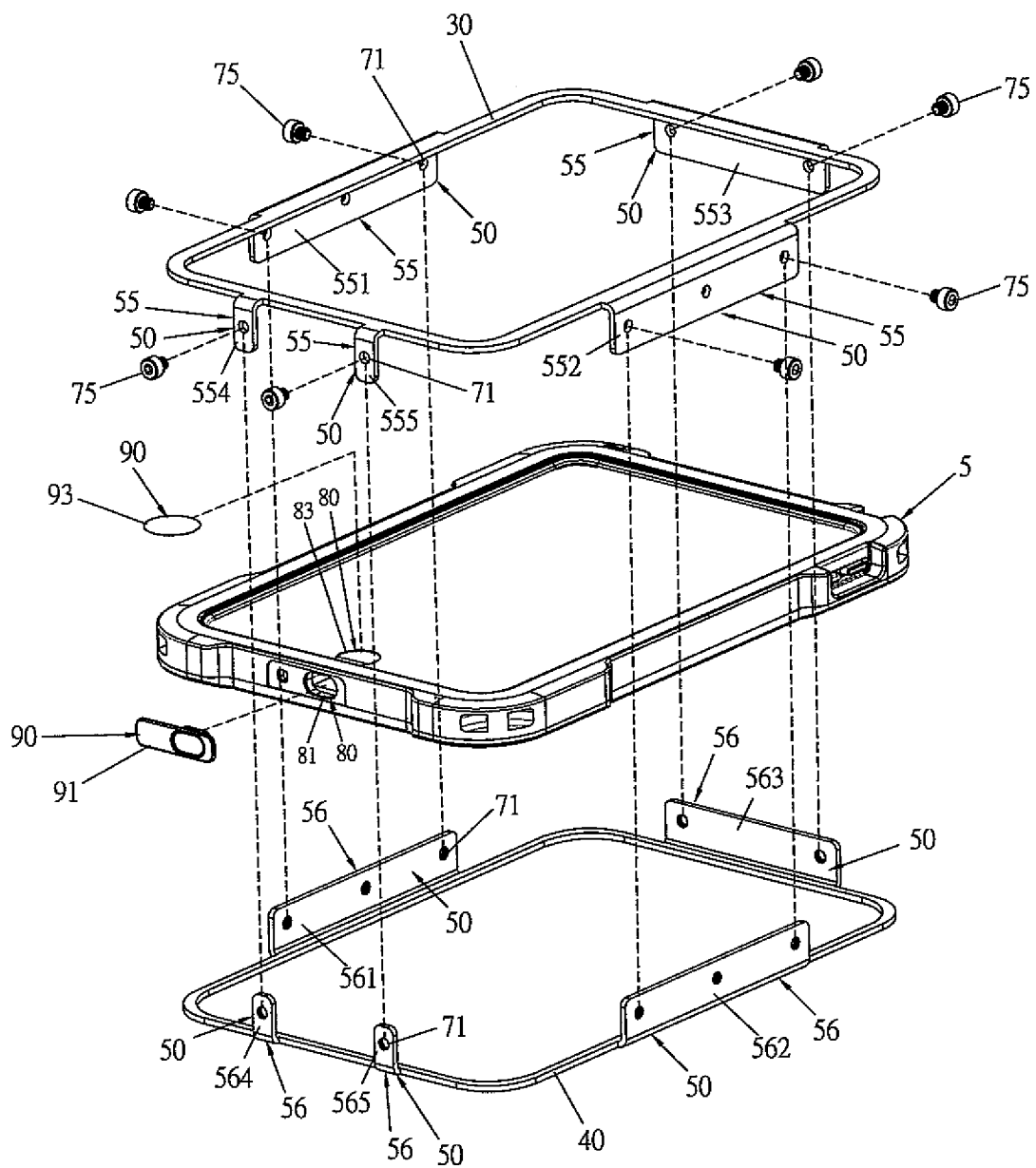
FIG. 2B is an exploded schematic view of the second embodiment of the present invention.
Figure 2C:
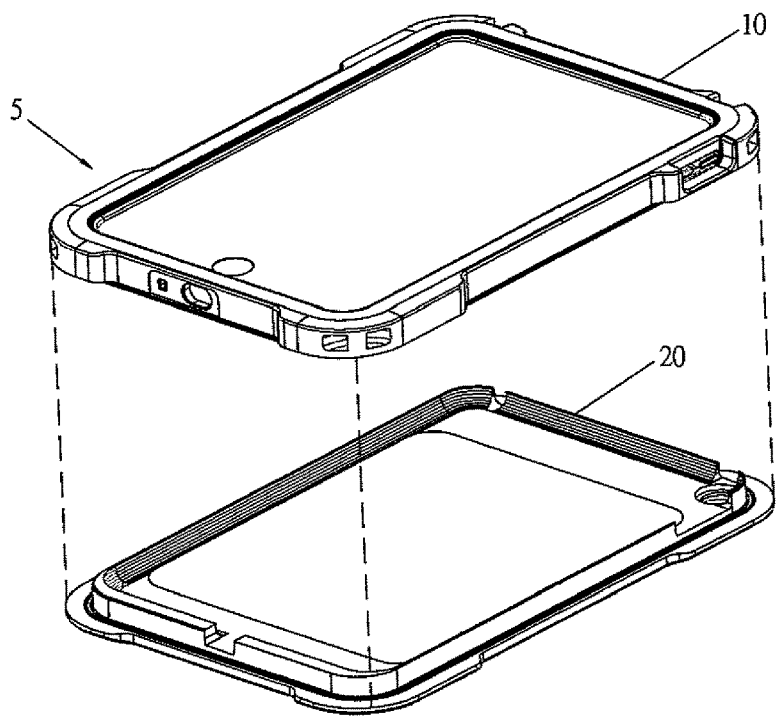
FIG. 2C is an exploded schematic view of the protection casing of the second embodiment of the present invention.
Figure 2D:
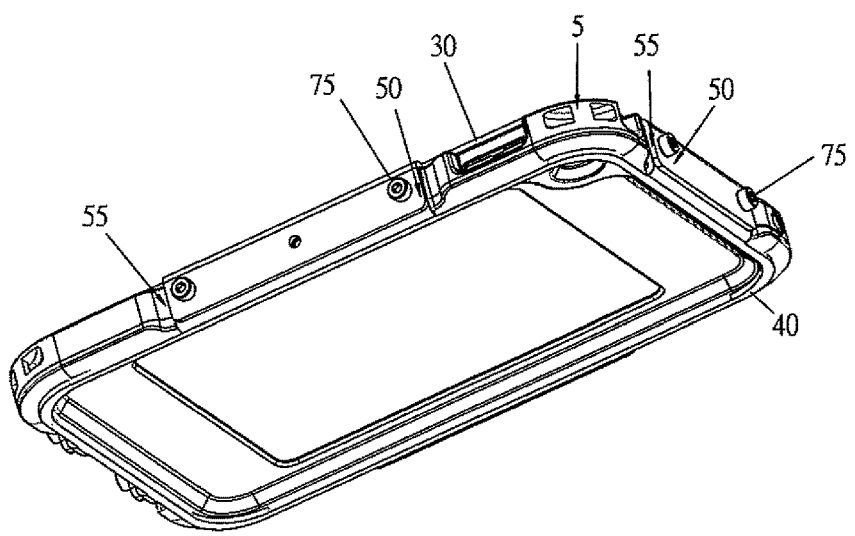
FIG. 2D is an assembly schematic view showing the bottom of the backside of the element in the second embodiment of the present invention.
Figure 2E:
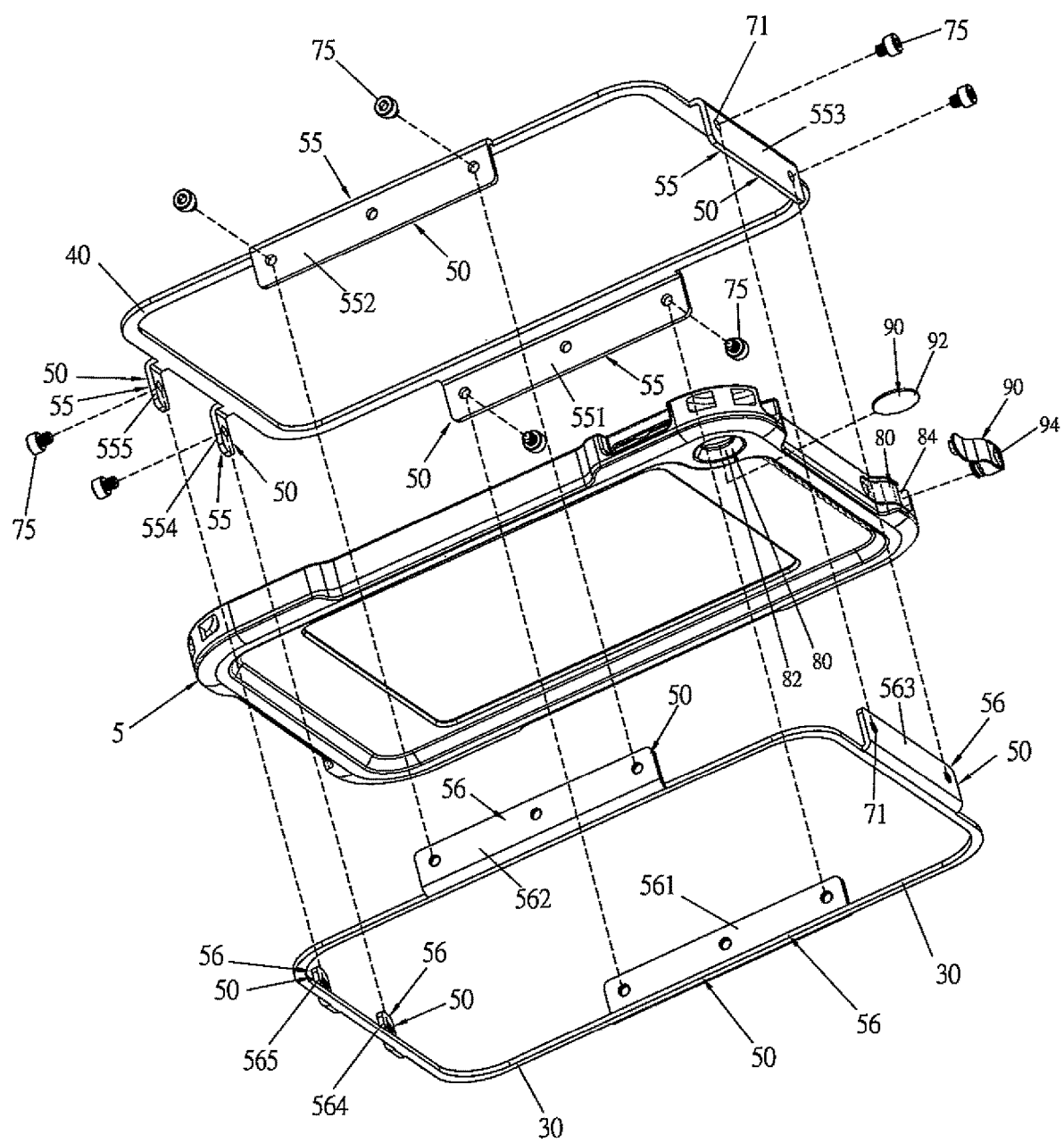
FIG. 2E is an exploded schematic view showing the bottom of the backside of the element in the second embodiment of the present invention.
Figure 3A:
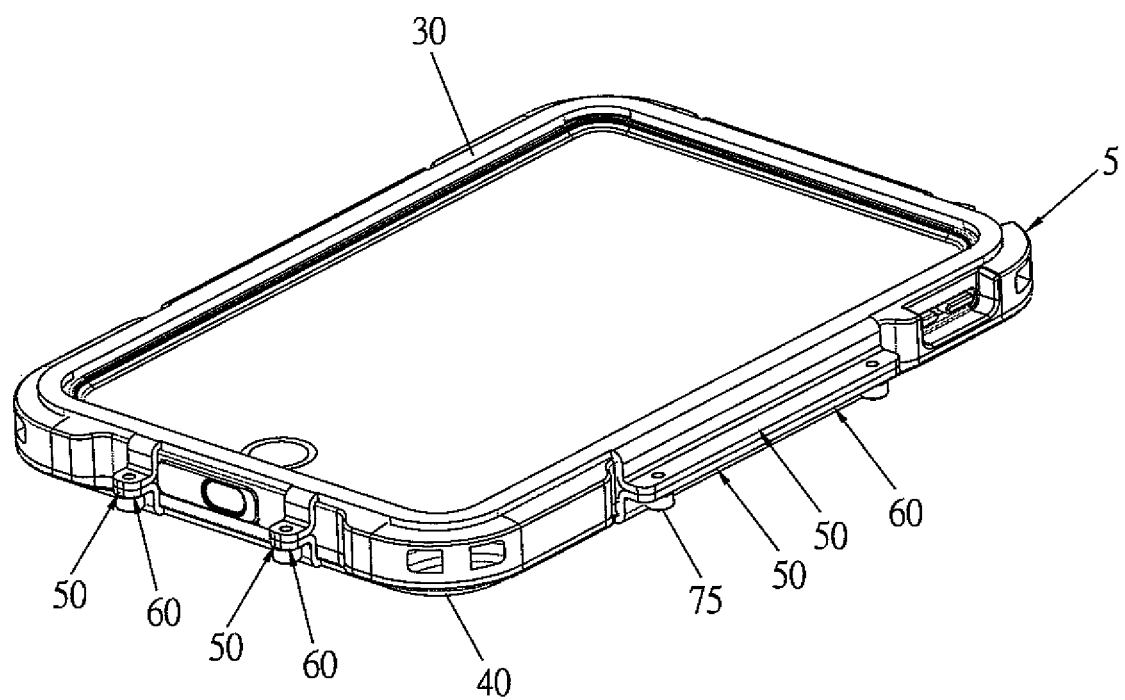
FIG. 3A is an assembly schematic view of the third embodiment of the present invention.
Figure 3B:
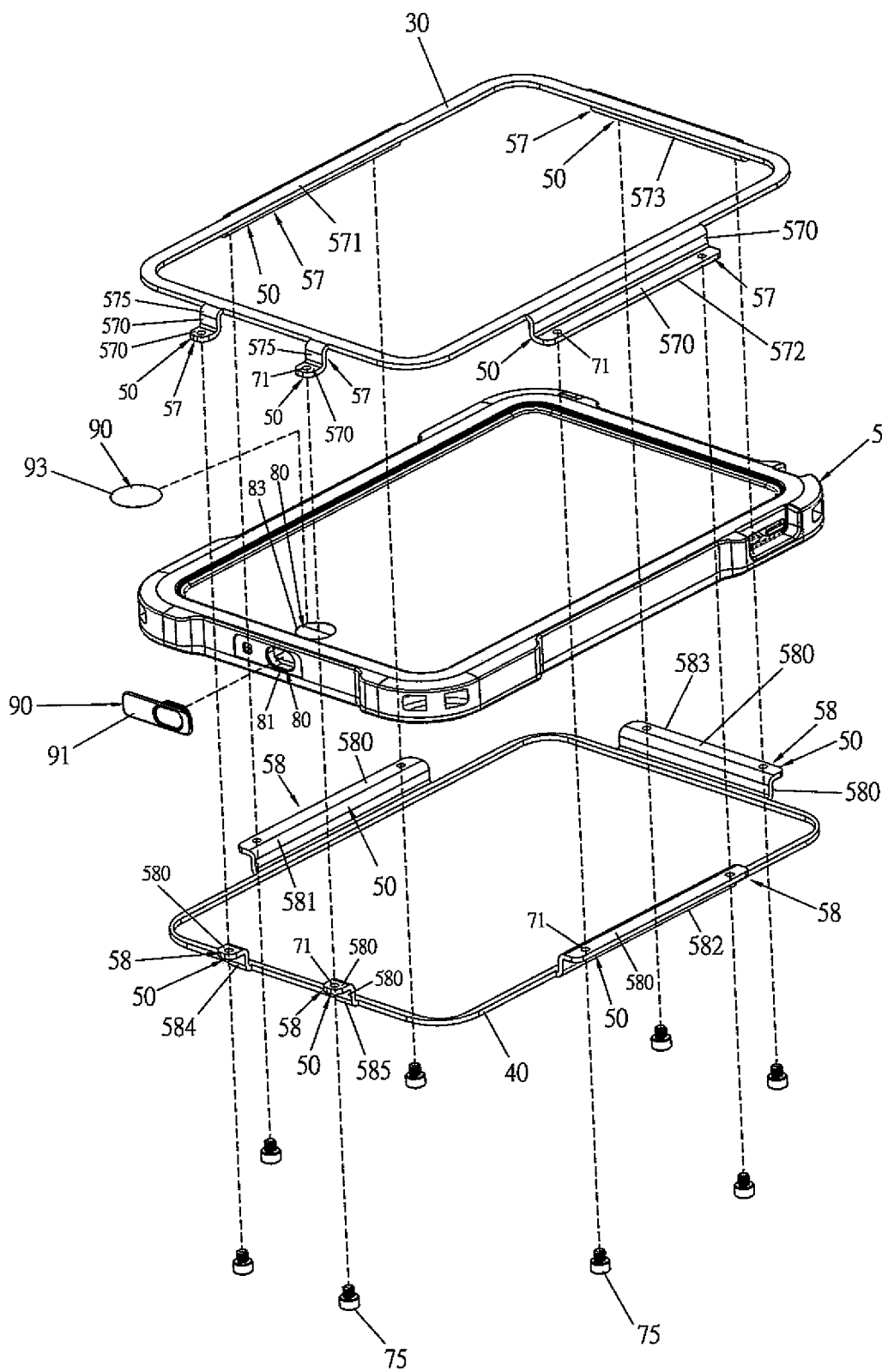
FIG. 3B is an exploded schematic view of the third embodiment of the present invention.
Figure 3C:
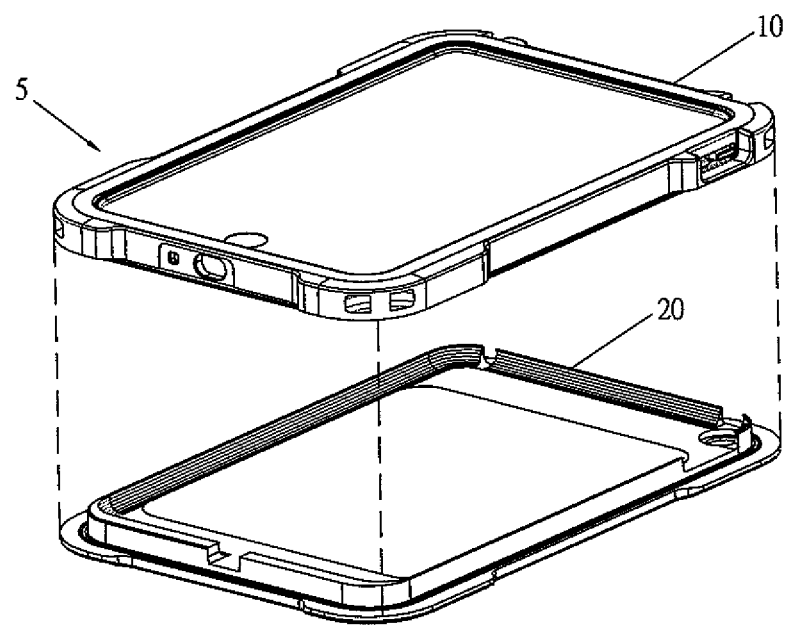
FIG. 3C is an exploded schematic view of the protection casing of the third embodiment of the present invention.
Figure 3D:
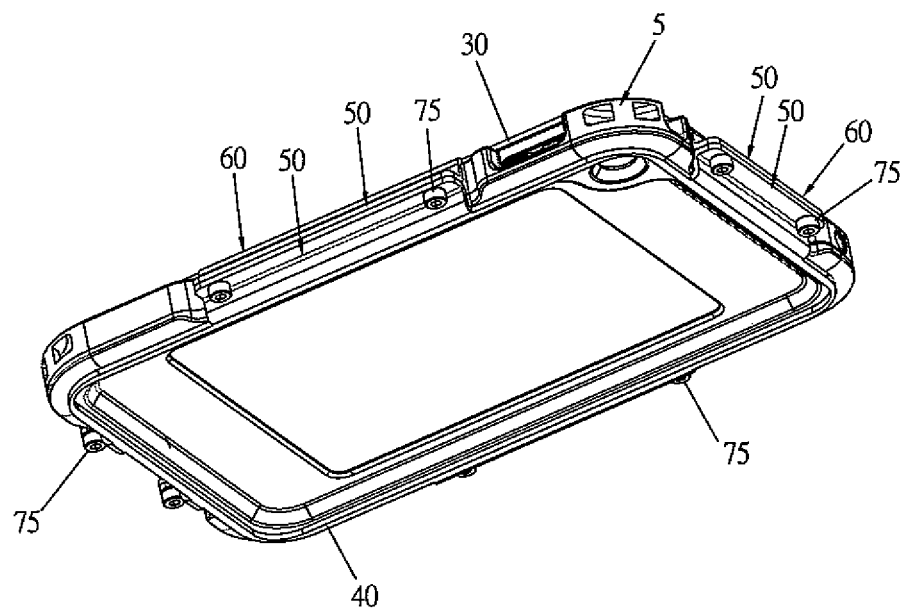
FIG. 3D is an assembly schematic view showing the bottom of the backside of the element in the third embodiment of the present invention.
Figure 3E:
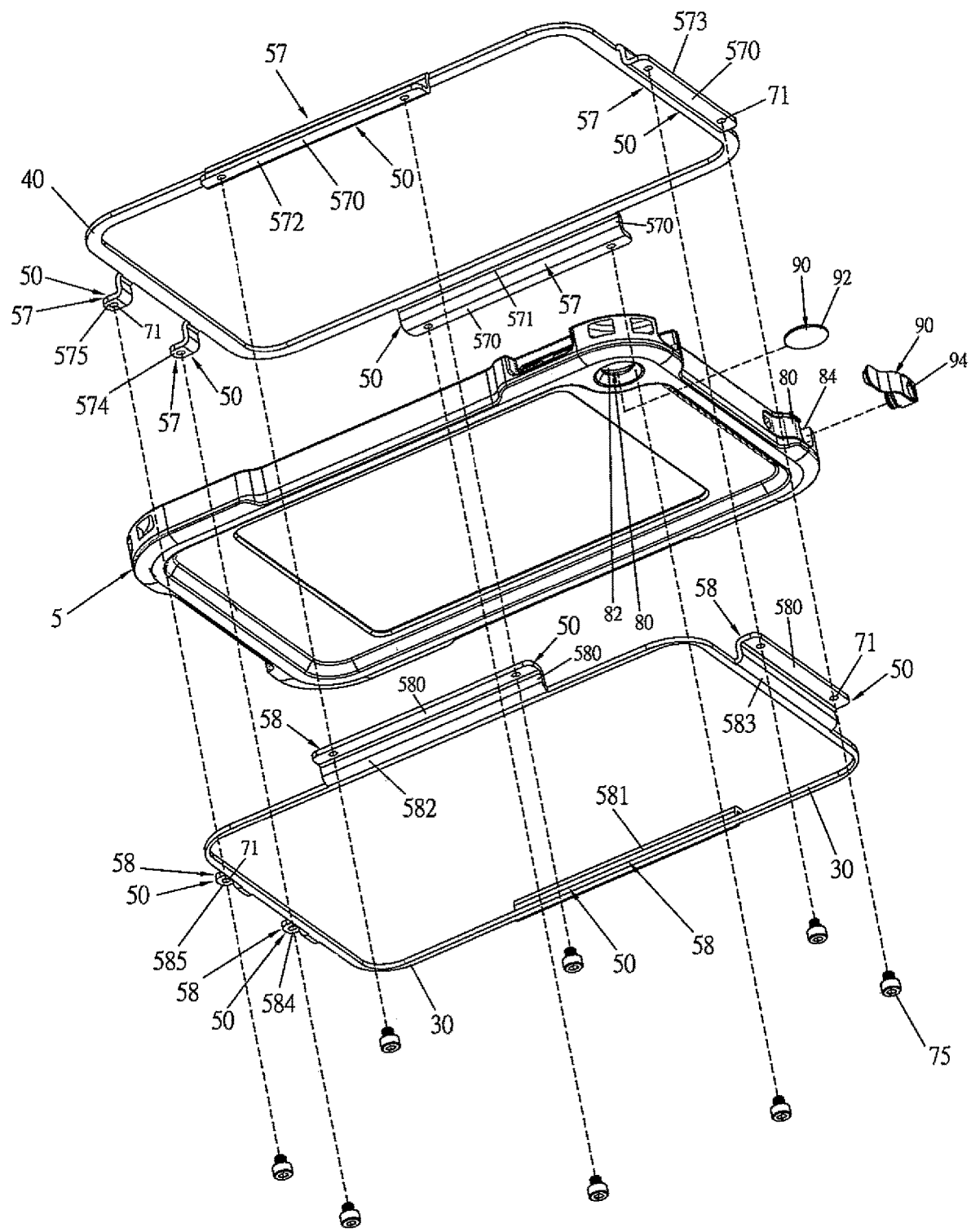
FIG. 3E is an exploded schematic view showing the bottom of the backside of the element in the third embodiment of the present invention.

With reference to FIGS. 1A to E, the clamping device for a protection casing of an electronic device is illustrated. The present invention serves to clamp a protection casing 5 for receiving an electronic device 1. As shown in FIGS. 1C, 2C and 3C, the protection casing 5 includes an upper cover 10 for covering an upper side of the electronic device 1 and a lower cover 20 for covering a lower side of the electronic device 1. In the present invention, the electronic device 1 is for example, a tablet (or flat form) electronic device, such as tablet computers, mobile phones, PDAs (personal digital assistants), notebook computers, etc. In assembly state, the upper cover 10 connects to the lower cover 20 and thus the electronic device 1 is enclosed therein. In application, the protection casing 5 has a plurality of function holes 80. Each of the function holes 80 has positioned to a position corresponding to that of a respective function component (not shown) of the electronic device 1. The plurality of function holes 80 include a connecting hole 81 in a front lateral side of the protection casing 5, a camera hole 82 in a bottom of the protection casing 5, a fingerprint identifying hole 83 in a top of the protection casing 5 and a headphone hole 84 in a rear lateral side of the protection casing 5. The present invention comprises the following elements.

An upper clamping frame 30 serves for clamping the protection casing 5 at an upper side thereof. In the present invention, the upper clamping frame 30 is a hollow rectangular frame.

A lower clamping frame 40 serves for clamping the protection casing 5 at a lower side thereof. The lower clamping frame 40 is a hollow protection casing 5. The lower clamping frame 40 has a shape corresponding to that of the upper clamping frame 30.

A combining structure 60 is arranged on lateral sides of the upper clamping frame 30 and lower clamping frame 40. The combining structure 60 serves to combine the upper clamping frame 30 and the lower clamping frame 40 to cause that the upper clamping frame 30 and the lower clamping frame 40 can clamp the protection casing 5 tightly so that the protection casing 5 retains its function for a long time.

The upper clamping frame 30, the lower clamping frame 40 and the combining structure 60 are not confined to the shapes shown in the drawings. All other structures which have the functions identical to those of the upper clamping frame 30 and lower clamping frame 40 are within the scope of the present invention.

In the present invention, the combining structure 60 includes at least one connection unit 50 for connecting the upper clamping frame 30 with the lower clamping frame 40. At least one side of each of the upper clamping frame 30 and the lower clamping frame 40 is arranged with the connection unit 50. In the present invention, the connection unit 50 is fixed to the upper clamping frame 30 and the lower clamping frame 40 by various forms.

Referring to FIGS. 1A to 1E, in the first embodiment of the present invention, the at least one connection unit 50 may have a form which is separated from the upper clamping frame 30 and the lower clamping frame 40. The at least one connection unit 50 includes two lateral connecting sheets 51, and 52, a rear connecting sheet 53, and two front connecting posts 54. Each of the connecting posts 54 and each of the connecting sheets 51, 52 and 53 are screwed to the upper clamping frame 30 and the lower clamping frame 40. As illustrated in FIG. 1B, the upper clamping frame 30, the lower clamping frame 40 and the connection unit 50 have screw holes 71 so that screws 75 are used to connect the connection unit 50 to the upper clamping frame 30 and the lower clamping frame 40 by screwing to the screw holes 71.

In screwing, screws 75 are used screw other objects (such as a frame, or a supporter, etc.) to the at least one connection unit 50.

With reference to FIGS. 2A to 2E, in the second embodiment of the present invention, the at least one connection unit 50 includes a plurality of upper connecting sheets 55 connecting to the upper clamping frame 30, and a plurality of lower connecting sheets 56 connecting to the lower clamping frame 40. Each of the upper connecting sheets 55 and the upper clamping frame 30 are formed as an integral structure. Each of the lower connecting sheets 56 and the lower clamping frame 40 are formed as an integral structure. Each of the lower connecting sheets 56 has positioned to a position corresponding to that of each of the upper connecting sheets 55. In the drawing shown the present embodiment, the electronic device 1 is not shown.

The upper connecting sheets 55 include two upper lateral connecting sheets 551, 552, an upper rear connecting sheet 553 and two upper front connecting sheets 554, 555. The lower connecting sheets 56 include two lower lateral connecting sheets 561, 562, a lower rear connecting sheet 563 and two lower front connecting sheets 564, 565. Each of the upper connecting sheets 55 is screwed into a respective one of the lower connecting sheets 56 to cause that the upper clamping frame 30 is connected to the lower clamping frame 40. With reference to FIG. 2B, each of the upper connecting sheets 55 and the lower connecting sheets 56 has screw holes 72 so that screws 75 are used to connect each of the upper connecting sheets 55 and each of the lower connecting sheets 56 by screwing to the screw holes 72.

In screwing, screws 75 are used to screw other objects (such as a frame, or a supporter, etc.) to the at least one connection unit 50.

As shown in FIGS. 3A to 3E, in the third embodiment of the present invention, the at least one connection unit 50 includes a plurality of upper connecting sheets 57 connecting to the upper clamping frame 30, and a plurality of lower connecting sheets 58 connecting to the lower clamping frame 40. Each of the upper connecting sheets 57 and the upper clamping frame 30 are formed as an integral structure. Each of the lower connecting sheets 56 and the lower clamping frame 40 are formed as an integral structure. Each of the lower connecting sheets 58 has positioned to a position corresponding to that of each of the upper connecting sheets 57. Each upper connecting sheet 57 includes two upper sub-sheets 570. The two upper sub-sheets 570 form an L shape. Each lower connecting sheet 58 includes two lower sub-sheets 580. The two lower sub-sheets 580 form an L shape. In the drawing shown the present embodiment, the electronic device 1 is not shown.

The upper connecting sheets 57 include two upper lateral connecting sheets 571, 572, an upper rear connecting sheet 573 and two upper front connecting sheets 574, 575. The lower connecting sheets 58 include two lower lateral connecting sheets 581, 582, a lower rear connecting sheet 583 and two lower front connecting sheets 584, 585. Each of the upper connecting sheets 57 is screwed into a respective one of the lower connecting sheets 58 to cause that the upper clamping frame 30 is connected to the lower clamping frame 40. As shown in FIG. 3B, a lateral side of one of the upper sub-sheets 570 is connected to the upper clamping frame 30 and a lateral side of one of the lower sub-sheets 580 is connected to the lower clamping frame 40. The other one of the upper sub-sheets 570 and the other one of the upper sub-sheets 580 have a plurality of screw holes 73 so that screws 75 are used to connect each of the upper connecting sheets 57 and each of the lower connecting sheets 58 by screwing to the screw holes 73.

In screwing, screws 75 are used screw other objects (such as a frame, or a supporter, etc.) to the at least one connection unit 50.

The present invention further comprises at least one plug 90. The at least one plug 90 serves to stuff into the respective function hole 80 of the protection casing 5 so that user can operate or view the function components (not shown) of the electronic device 1 in an inner side of the function holes 80.

The at least one plug 90 includes a connecting plug 91 capable of being stuffed into the connecting hole 81, a camera plug 92 capable of being stuffed into the camera hole 82, a fingerprint identifying plug 93 capable of being stuffed into the fingerprint identifying hole 83 and a headphone plug 94 capable of being stuffed into the headphone hole 84.

The upper clamping frame 30 and the lower clamping frame 40 are not confined to the shapes shown in the drawings. All other structures which have the functions identical to those of the upper clamping frame 30 and lower clamping frame 40 are within the scope of the present invention.

Advantages of the present invention are that in the present invention, the upper clamping frame, the lower clamping frame and the combining structure form a clamping device. The combining structure serves to combine the upper clamping frame and the lower clamping frame to cause the upper clamping frame and the lower clamping frame can clamp the protection casing tightly so that the protection casing retains its function for a long time. The clamping device of the present invention can cause that the whole structure has higher strength and the ability of anti-collision. Therefore, the clamping device of the present invention prevents the protection casing from breaking down due to collision or overdoing of operating actions. Moreover, with the clamping device of the present invention, the protection casing will have a higher sealing tightness and thus dusts or water is impossible to enter into the protection casing.

The present invention is thus described, it will be obvious that the same may be varied in many ways. Such variations are not to be regarded as a departure from the spirit and scope of the present invention, and all such modifications as would be obvious to one skilled in the art are intended to be included within the scope of the following claims.

What is claimed is:

1. A clamping device for a protection casing of an electronic device; the clamping device serving to clamp a protection casing for receiving an electronic device; wherein the protection casing includes an upper cover for covering an upper side of the electronic device and a lower cover for covering a lower side of the electronic device; and in assembly state, the upper cover is connected to the lower cover and thus the electronic device is enclosed therein; the clamping device comprising:

an upper clamping frame for clamping the protection casing at an upper side thereof;

a lower clamping frame for clamping the protection casing at a lower side thereof; and a combining structure arranged on lateral sides of the upper clamping frame and the lower clamping frame; the combining structure serving to combine the upper clamping frame and the lower clamping frame so that the upper clamping frame and the lower clamping frame clamp the protection casing tightly and thus the protection casing retains its function for a long time;

wherein the combining structure includes at least one connection unit for connecting the upper clamping frame with the lower clamping frame; and at least one side of each of the upper clamping frame and the lower clamping frame is arranged with the connection unit;

wherein the at least one connection unit includes a plurality of upper connecting sheets connecting to the upper clamping frame, and a plurality of lower connecting sheets connecting to the lower clamping frame; each of the upper connecting sheets and the upper clamping frame are formed as an integral structure; each of the lower connecting sheets and the lower clamping frame are formed as an integral structure; each of the lower connecting sheets has positioned to a position corresponding to that of each of the upper connecting sheets; and wherein the upper connecting sheets include two upper lateral connecting sheets and an upper rear connecting sheet; and the lower connecting sheets include two lower lateral connecting sheets and a lower rear connecting sheet.

2. The clamping device for a protection casing of an electronic device as claimed in claim 1, wherein the upper clamping frame is a hollow rectangular frame; the lower clamping frame is a hollow protection casing; and the lower clamping frame has a shape corresponding to that of the upper clamping frame.

3. The clamping device for a protection casing of an electronic device as claimed in claim 1, wherein the upper connecting sheets further include two upper front connecting sheets; and the lower connecting sheets further include two lower front connecting sheets.

4. The clamping device for a protection casing of an electronic device as claimed in claim 1, wherein each of the upper connecting sheets is screwed into a respective one of the lower connecting sheets to cause that the upper clamping frame is connected to the lower clamping frame; each of the upper connecting sheets and the lower connecting sheets has screw holes so that screws are used to connect each of the upper connecting sheets and each of the lower connecting sheets by screwing to the screw holes.

5. The clamping device for a protection casing of an electronic device as claimed in claim 4, wherein in screwing, screws are used screw other objects to the at least one connection unit.

6. A clamping device for a protection casing of an electronic device; the clamping device serving to clamp a protection casing for receiving an electronic device; wherein the protection casing includes an upper cover for covering an upper side of the electronic device and a lower cover for covering a lower side of the electronic device; and in assembly state, the upper cover is connected to the lower cover and thus the electronic device is enclosed therein; the clamping device comprising:

an upper clamping frame for clamping the protection casing at an upper side thereof;

a lower clamping frame for clamping the protection casing at a lower side thereof; and a combining structure arranged on lateral sides of the upper clamping frame and the lower clamping frame; the combining structure serving to combine the upper clamping frame and the lower clamping frame so that the upper clamping frame and the lower clamping frame clamp the protection casing tightly and thus the protection casing retains its function for a long time;

wherein the combining structure includes at least one connection unit for connecting the upper clamping frame with the lower clamping frame; and at least one side of each of the upper clamping frame and the lower clamping frame is arranged with the connection unit;

wherein the at least one connection unit includes a plurality of upper connecting sheets connecting to the upper clamping frame, and a plurality of lower connecting sheets connecting to the lower clamping frame; each of the upper connecting sheets and the upper clamping frame are formed as an integral structure; each of the lower connecting sheets and the lower clamping frame are formed as an integral structure; each of the lower connecting sheets has positioned to a position corresponding to that of each of the upper connecting sheets; each upper connecting sheet includes two upper sub-sheets; the two upper sub-sheets form an L shape; each lower connecting sheet includes two lower sub-sheets; the two lower sub-sheets form an L shape; and wherein the upper connecting sheets include two upper lateral connecting sheets and an upper rear connecting sheet; the lower connecting sheets include two lower lateral connecting sheets and a lower rear connecting sheet.

7. The clamping device for a protection casing of an electronic device as claimed in claim 6, wherein the upper connecting sheets further include two upper front connecting sheets; and the lower connecting sheets further include two lower front connecting sheets.

8. The clamping device for a protection casing of an electronic device as claimed in claim 6, wherein each of the upper connecting sheets is screwed into a respective one of the lower connecting sheets to cause that the upper clamping frame is connected to the lower clamping frame; a lateral side of one of the upper sub-sheets is connected to the upper clamping frame and a lateral side of one of the lower sub-sheets is connected to the lower clamping frame; and the other one of the upper sub-sheets and the other one of the upper sub-sheets have a plurality of screw holes so that screws are used to connect each of the upper connecting sheets and each of the lower connecting sheets by screwing to the screw holes.

9. The clamping device for a protection casing of an electronic device as claimed in claim 8, wherein in screwing, screws are used screw other objects to the at least one connection unit.

* * * * *